United States Patent
Liu et al.

(10) Patent No.: US 9,034,726 B2
(45) Date of Patent: May 19, 2015

(54) SEMICONDUCTOR PROCESS

(71) Applicant: UNITED MICROELECTRONICS CORP., Hsin-Chu (TW)

(72) Inventors: Chih-Chien Liu, Taipei (TW); Chia-Lung Chang, Tainan (TW); Jei-Ming Chen, Tainan (TW); Jui-Min Lee, Taichung (TW); Yuh-Min Lin, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/285,645

(22) Filed: May 23, 2014

(65) Prior Publication Data

US 2014/0256115 A1    Sep. 11, 2014

Related U.S. Application Data

(62) Division of application No. 13/517,573, filed on Jun. 13, 2012, now Pat. No. 8,772,904.

(51) Int. Cl.
*H01L 21/762*    (2006.01)
*H01L 29/06*    (2006.01)

(52) U.S. Cl.
CPC ....... *H01L 21/76224* (2013.01); *H01L 29/0649* (2013.01)

(58) Field of Classification Search
CPC .................. H01L 21/76224; H01L 29/0649
USPC .......... 257/374, 506, 510, E21.545, E21.546, 257/E29.02; 438/435, 437
See application file for complete search history.

(56) References Cited

U.S. PATENT DOCUMENTS

| | | | |
|---|---|---|---|
| 6,251,746 B1 | 6/2001 | Hong | |
| 6,576,530 B1 | 6/2003 | Chen | |
| 6,727,159 B2 * | 4/2004 | Chen et al. | 438/435 |
| 6,784,077 B1 | 8/2004 | Lin | |
| 6,806,165 B1 | 10/2004 | Hopper | |
| 7,098,115 B2 * | 8/2006 | Tanaka et al. | 438/424 |
| 7,271,463 B2 | 9/2007 | Smythe, III | |
| 7,271,464 B2 * | 9/2007 | Trivedi et al. | 257/524 |
| 7,479,440 B2 | 1/2009 | Smythe, III | |
| 7,947,551 B1 | 5/2011 | Syue | |
| 2003/0143854 A1 | 7/2003 | Chen | |
| 2004/0005781 A1 | 1/2004 | Huang | |
| 2004/0266176 A1 * | 12/2004 | Tanaka et al. | 438/637 |
| 2005/0263827 A1 | 12/2005 | Shiba | |
| 2006/0043521 A1 * | 3/2006 | Trivedi et al. | 257/499 |
| 2006/0223280 A1 | 10/2006 | Ueda | |
| 2007/0178664 A1 * | 8/2007 | Tseng et al. | 438/424 |

* cited by examiner

*Primary Examiner* — Allan R Wilson
(74) *Attorney, Agent, or Firm* — Winston Hsu; Scott Margo

(57) ABSTRACT

A semiconductor structure is located in a recess of a substrate. The semiconductor structure includes a liner, a silicon rich layer and a filling material. The liner is located on the surface of the recess. The silicon rich layer is located on the liner. The filling material is located on the silicon rich layer and fills the recess. Furthermore, a semiconductor process forming said semiconductor structure is also provided.

11 Claims, 5 Drawing Sheets

US 9,034,726 B2

SEMICONDUCTOR PROCESS

CROSS REFERENCE TO RELATED APPLICATIONS

This application is a divisional application of and claims the benefit of U.S. patent application Ser. No. 13/517,573, filed Jun. 13, 2012.

BACKGROUND OF THE INVENTION

1. Field of the Invention

The present invention relates generally to a semiconductor structure and a process thereof, and more specifically to a semiconductor structure and a process thereof, that forms a silicon rich layer on a surface of a recess.

2. Description of the Prior Art

In the present semiconductor process, a localized oxidation isolation (LOCOS) or a shallow trench isolation (STI) are normally used to isolate the MOS transistors. However, with the reduction in both design size and fabricating line width of the semiconductor wafer, the drawbacks of pits, crystal defects and longer bird's beak in the LOCOS process will affect even more the characteristics of the semiconductor wafer. The field oxide produced in the LOCOS process also occupies a larger volume, which affects the integration of the semiconductor wafer. Thus, in the submicron semiconductor process, the STI process is widely used as an isolation technique because of its smaller size and improved integration potential.

The typical fabrication method of a STI is to first form shallow trenches between each MOS device in the surface of the semiconductor wafer, and a dielectric matter is filled into the shallow trenches to obtain an electrical isolation effect. The dielectric matter is composed of silicon oxide. As the silicon oxide is formed, the high temperature in steps for forming silicon oxide or latter processes would induce oxygen atoms diffusing into the silicon substrate of the active regions for forming transistors beside the recess, so that parts of the silicon substrate will be oxidized into silicon oxide. As a result, not only sizes of each shallow trench isolation structures can not be controlled precisely, but also the volumes of formed shallow trench isolation structures increase, which reduces the silicon substrate of the active regions. Even worse, as the sizes of the semiconductor components shrink and get close to their physical limitations, the shallow trench isolation structures with different sizes and the active regions with different sizes dramatically reversely affect the electrical performances of the components and their processing qualities.

SUMMARY OF THE INVENTION

To solve said problems, the present invention provides a semiconductor structure and a process thereof that forms a silicon rich layer on a surface of a recess, especially for a recess used to form a shallow trench isolation structure.

The present invention provides a semiconductor structure located in a recess of a substrate. The semiconductor structure includes a liner, a silicon rich layer and a filling material. The liner is located on the surface of the recess. The silicon rich layer is located on the liner. The filling material is located on the silicon rich layer and fills the recess.

The present invention provides a semiconductor process including the following. A recess is formed in a substrate. A liner covers the surface of the recess. A silicon rich layer is formed on the liner. A silicon nitride compound is filled in the recess. A transforming process is performed to transform the silicon nitride compound into a silicon oxide and at least oxidize apart of the silicon rich layer.

According to the above, the present invention provides a semiconductor structure and process thereof, which forms a silicon rich layer on a surface of a recess, especially for a recess used for forming a shallow trench isolation structure, fills a silicon nitride compound into the recess, and then transforms the silicon nitride compound into a filling material which is located between the active regions for isolation purposes. This way, since the silicon rich layer formed on the surface of the recess before the silicon nitride compound is filled, the ingredients imported during the transforming process, such as oxygen atoms, can be prevented from diffusing into the substrate beside the recess that occupies a part of the substrate of the active regions and expands the volume of formed shallow trench isolation structures.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
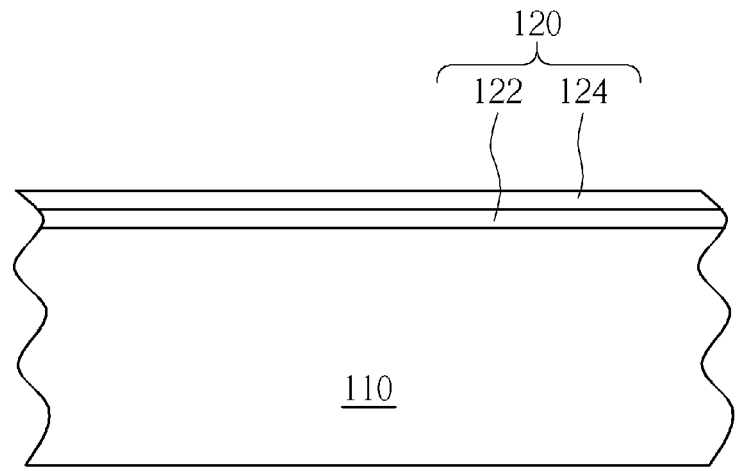
FIGS. 1-10 schematically depict cross-sectional views of a semiconductor process according to an embodiment of the present invention.
Figure 2:
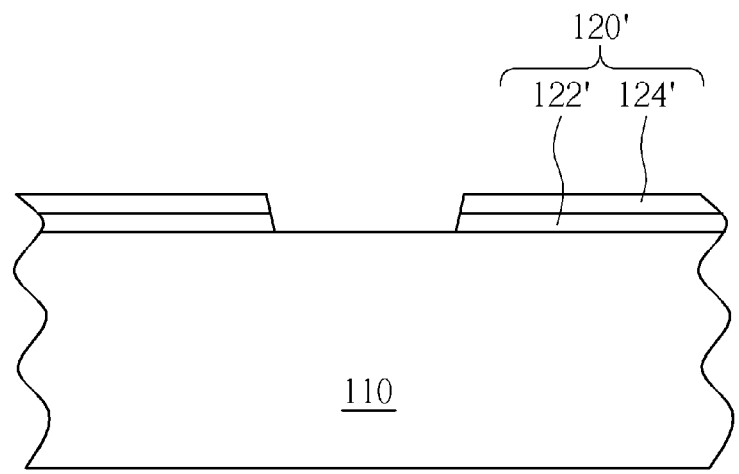
Figure 3:
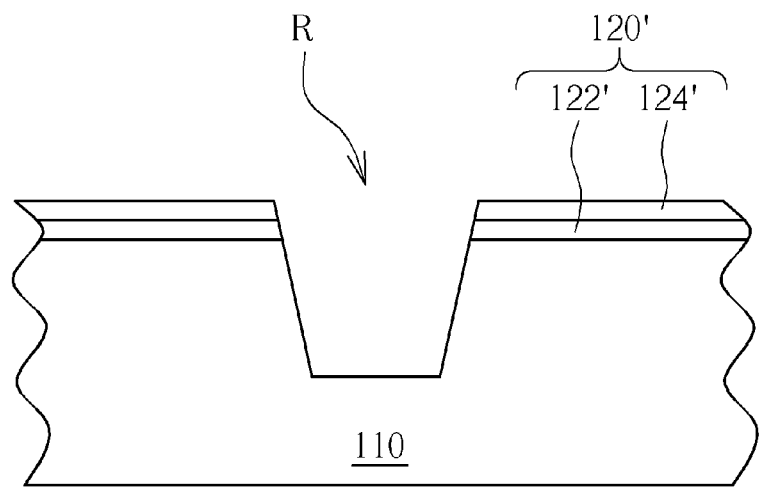

FIGS. 1-10 schematically depict cross-sectional views of a semiconductor process according to an embodiment of the present invention. As shown in FIGS. 1-3, a substrate 110 having a recess R is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A hard mask layer 120 is formed on the substrate 110. In this embodiment, the hard mask layer 120 includes a pad oxide layer 122 and a pad nitride layer 124 on the substrate 110 from bottom to top, but it is not limited thereto.

As shown in FIG. 2, the hard mask layer 120 is patterned to form a patterned hard mask layer 120' which includes a patterned pad oxide layer 122' and a patterned pad nitride layer 124'. The methods of forming the patterned hard mask layer 120' include the following steps. A patterned photoresist (not shown) is formed on the hard mask layer 120 by methods such as photolithography. The pattern of the patterned photoresist (not shown) defines the corresponding position of the recess R below. An etching process is performed to form the patterned hard mask layer 120' by using the pattern of the patterned photoresist (not shown) as a hard mask. After the patterned photoresist (not shown) is selectively removed, as shown in FIG. 3, the pattern of the patterned hard mask layer 120' is transferred to the substrate 110 by methods such as etching to form the recess R in the substrate 110.

Figure 4:
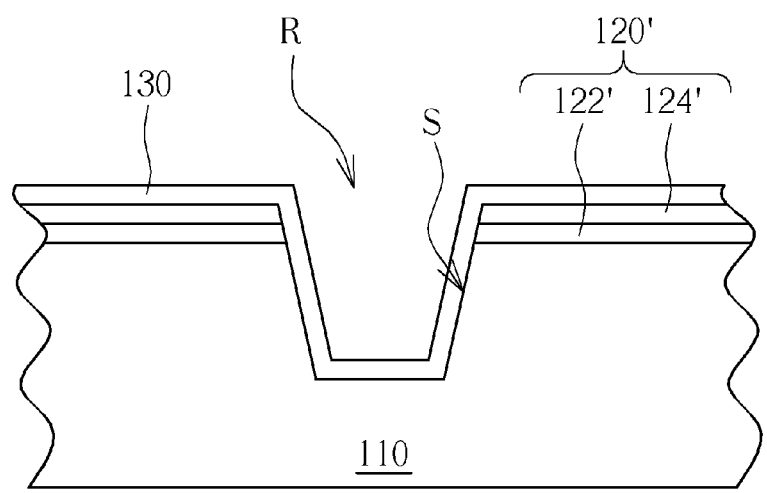

As shown in FIG. 4, a liner 130 is formed to entirely cover the substrate 110, especially to cover the surface S of the recess R. The liner 130 may be an oxide layer and/or a nitride layer etc, which may be formed by an in situ steam generation (ISSG) process, but it is not limited thereto.

Figure 5:
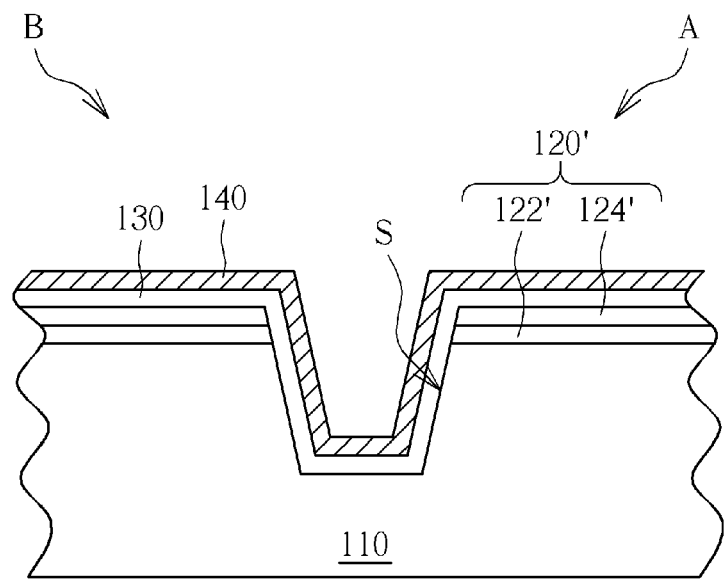

As shown in FIG. 5, a silicon rich layer 140 is formed on the liner 130. In this embodiment, the silicon rich layer 140 is a silicon layer. But in another embodiment, the silicon rich layer 140 may be a silicon rich compound layer such as a silicon nitride layer, a silicon oxide layer, a silicon oxynitride layer or a carbon-containing silicon nitride layer. There are less oxygen atoms in the silicon rich compound layer molecules than in normal ones. In a silicon oxide layer for example, the molecular chemical formula may be SiOx with x<2. The silicon rich layer 140 may be formed of a Plasma Enhanced Chemical Vapor Deposition (PECVD) process or an Atomic Layer Deposition (ALD) etc. Which way is applied to form the silicon rich layer 140 depends upon the desired function of the silicon rich layer 140.

The purpose of forming the silicon rich layer 140 of the present invention is to prevent the ingredients of the filling material (not shown) filled into the recess and formed on the silicon rich layer 140 or the ingredients imported in later processes, such as oxygen atoms, from diffusing into the substrate 110 beside the recess R, that occupies a part of the active regions A and B designed to form semiconductor structures such as transistors and to extend the volume of formed shallow trench isolation structures (not shown). Thus, the methods for preventing ingredients of the filling material or ingredients of imported materials in latter processes from polluting the substrate 110 may include the following steps. (1) The ingredient of the filling material or the ingredients of imported materials in latter processes are absorbed by the silicon rich layer 140. For example, silicon is provided in the silicon rich layer 140 to react with and consume oxygen atoms in the filling material or imported in latter processes; thereby preventing the oxygen atoms from diffusing into the substrate 110. This way, the silicon rich layer 140 is preferred to have a loose structure, so that there is enough space to absorb the ingredients of the filling material or the ingredients of the imported materials in latter processes. The silicon rich layer 140 is therefore preferred to be formed through a Plasma Enhanced Chemical Vapor Deposition (PECVD) process. (2) In another way, the ingredients of the filling material or the ingredients of the imported materials in latter processes can be blocked and prevented from diffusing into the silicon rich layer 140. This way, the silicon rich layer 140 is preferred to have a dense structure to effectively prevent the ingredients of the filling material or the ingredients of the imported materials in latter processes from diffusing into the silicon rich layer 140. The silicon rich layer 140 is therefore preferred to be formed through an Atomic Layer Deposition (ALD) process.

Moreover, the silicon rich layer 140 is preferred to be formed on the liner 130. Since the silicon rich layer 140 contains silicon and the substrate 110 is also a silicon substrate, the liner 130 can isolate both of them, enabling the silicon rich layer 140 to have better structural performances. Besides, the liner 130 can prevent ingredients in the filling materials from diffusing into the substrate 110. As the stress of the silicon rich layer 140 such as a Si-rich SiN with higher stress is large, the liner 130 can be a stress buffer layer preventing the silicon rich layer 140 from peeling off.

Figure 6:
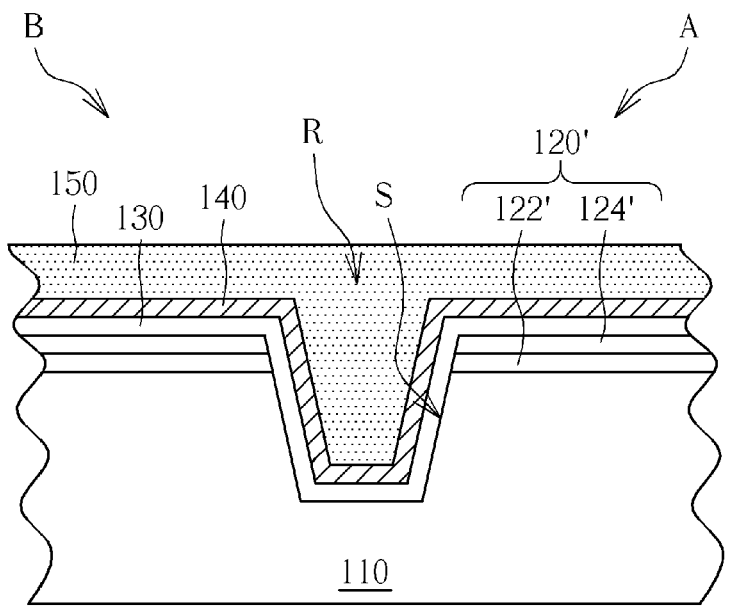

As shown in FIG. 6, a filling material 150 is filled into the recess R. In this embodiment, the filling material 150 is a silicon nitride compound; in another embodiment, the filling material 150 may be a silicon oxide compound, but it is not limited thereto. The filling material 150 is often used under liquid state to fill the recess R, wherein the filling material 150 may include trisilylamine (TSA), but it is not limited thereto. As the size of semiconductor components shrinks, the depth of the recess R may approach 3000 Å (angstrom) while the opening diameter of the recess R may approach 500 Å (angstrom); therefore it is not easy for the recess having such high depth/width ratio being etched to have a broadened profile from bottom to top and smooth cross-sectional profile. Thus, as the filling material 150 is under liquid state, the recess R can be filled with the filling material 150 completely. In another embodiment, the filling material 150 may have another physical state in addition.

Figure 7:
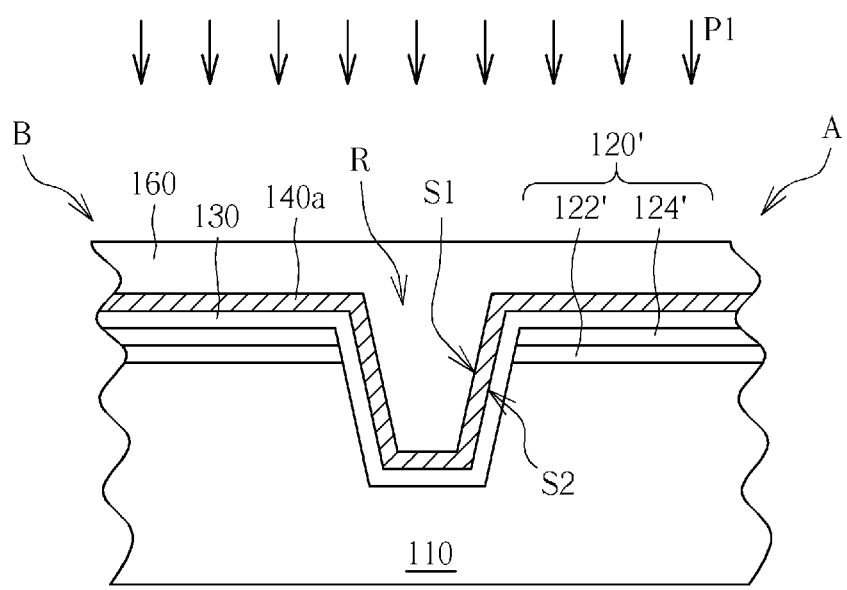

As shown in FIG. 7, a transforming process P1 is performed to transform the filling material 150 into a filling material 160 to isolate semiconductor components such as transistors formed in the active regions A and B. In this embodiment, the filling material 160 is a silicon oxide, and part of the silicon rich layer 140 is oxidized while the filling material 150 is transformed, so that an oxygen-containing silicon rich layer 140a is formed. Since the silicon rich layer 140 is a silicon layer, the silicon rich layer 140 is preferred to be transformed into a silicon oxide layer completely. By doing this, the silicon rich layer 140 and the filling material 160 can be transformed into silicon oxide entirely for isolation purposes, but it is not limited thereto. In another embodiment, as the silicon rich layer 140 is a silicon nitride layer, the oxygen-containing silicon rich layer 140a is a silicon oxynitride layer; as the silicon rich layer 140 is a carbon-containing silicon nitride layer, the oxygen-containing silicon rich layer 140a is a carbon-containing silicon oxynitride layer. In this embodiment, the transforming process P1 is an oxidation process, but it is not limited thereto. Specifically, the oxidation process may include importing oxygen gas, ozone gas or vapor etc. The processing temperature of the transforming process P1 may be in the range of 500° C.~700° C., enabling the filling material 150 to be fully transformed into the filling material 160. Furthermore, as the filling material 150 is transformed into the filling material 160, a part of the silicon rich layer 140 may be oxidized so that the oxygen-containing silicon rich layer 140a can be formed. In one case, the oxygen content of the oxygen-containing silicon rich layer 140a has a distribution gradient. For example, the oxygen content of the oxygen-containing silicon rich layer 140a has a distribution gradient decreasing from the contact surfaces S1 between the filling material 160 and the oxygen-containing silicon rich layer 140a to the contact surface S2 between the oxygen-containing silicon rich layer 140a and the liner 130. The oxygen content of the oxygen-containing silicon rich layer 140a depends upon the concentration of imported oxygen atoms or the structural density of the silicon rich layer 140. As the silicon rich layer 140 is formed through a Plasma Enhanced Chemical Vapor Deposition (PECVD), the silicon rich layer 140 would have a loose structure, and can absorb more oxygen atoms, so that the oxygen-containing silicon rich layer 140a has a greater oxygen content; as the silicon rich layer 140 is formed through an Atomic Layer Deposition (ALD), the silicon rich layer 140 would have a dense structure, and more oxygen atoms are stopped to diffuse into it, so that the oxygen-containing silicon rich layer 140a has a smaller oxygen content.

Figure 8:
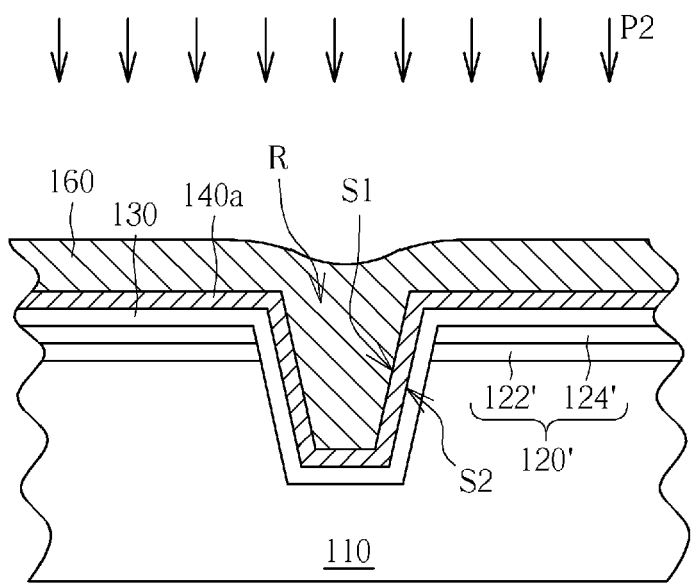

As shown in FIG. 8, a densification process P2 may be selectively performed to densify the filling material 160 and the oxygen-containing silicon rich layer 140a. The densification process P2 may include a thermal process or an oxygen containing treatment process etc. The processing temperature of the densification process P2 is preferred to be higher than 1000° C. to achieve the obvious effect of densification. The processing temperature of the densification process P2 is preferred to be 1100° C. Similarly, the oxygen-containing silicon rich layer 140a of the present invention can be used to absorb or stop the oxygen atoms activated by the temperature of the densification process P2 or imported during the densification process P2.

Figure 9:
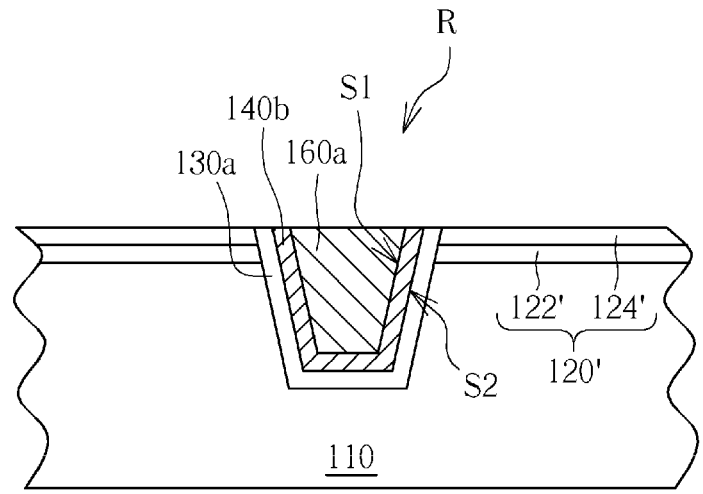
Figure 10:
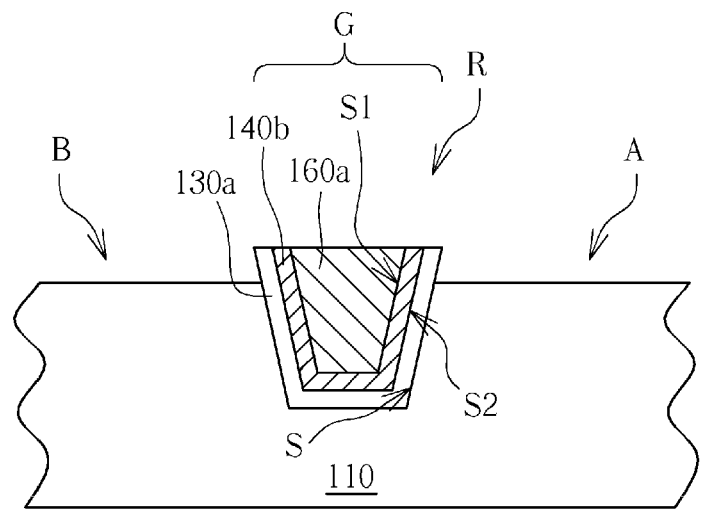

The filling material 160, the oxygen-containing silicon rich layer 140a and the liner 130 are planarized, as shown in FIG. 9, so that a planarized filling material 160a, a planarized silicon rich layer 140*b* and a planarized liner 130*a*, leveled with the hard mask layer 120', are formed. Then, the hard mask layer 120' is removed, as shown in FIG. 10, and a shallow trench isolation structure G is now formed. Thereafter, semiconductor processes to form structures such as transistors can be performed in the active regions A and B. The semiconductor processes are known in the art, and will not be described here.

According to the above, the filling material 150 is filled and then the transforming process P1 is performed to form the filling material 160 and the steps of oxidizing a part of the silicon rich layer 140 can include a flowable chemical vapor deposition (FCVD) process or in a spin-on dielectric (SOD) process etc.

To summarize, the present invention provides a semiconductor structure and a process thereof, which forms a silicon rich layer on a surface of a recess, especially for a recess used to form a shallow trench isolation structure, fills a silicon nitride compound into the recess, and then transforms the silicon nitride compound into a filling material, which is located between active regions for isolation purposes. This way, since the silicon rich layer being formed on the surface of the recess before the silicon nitride compound is filled in the present invention, the ingredients of the filling material and the imported ingredients during the transforming process, such as oxygen atoms, can be prevented from diffusing into the substrate beside the recess that occupies a part of the substrate of the active regions and extends the volume of formed the shallow trench isolation structure. More precisely, the silicon rich layer may include a silicon layer, a silicon nitride layer, a silicon oxide layer, a silicon oxynitride layer or a carbon-containing silicon nitride layer etc, and the silicon rich layer may be formed by a Plasma Enhanced Chemical Vapor Deposition (PECVD) process or an Atomic Layer Deposition (ALD) process etc.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
    forming a recess in a substrate;
    forming a liner covering the surface of the recess;
    forming a silicon rich layer on the liner;
    filling a silicon nitride compound in the recess;
    performing a transforming process to transform the silicon nitride compound into a silicon oxide and at least oxidize part of the silicon rich layer; and
    performing a densification process to densify the silicon oxide and the silicon rich layer after the transforming process is performed.

2. The semiconductor process according to claim 1, wherein the liner comprises an oxide layer.

3. The semiconductor process according to claim 1, wherein the silicon rich layer comprises a silicon layer, a silicon nitride layer, a silicon oxide layer, a silicon oxynitride layer or a carbon-containing silicon nitride layer.

4. The semiconductor process according to claim 1, wherein the processing temperature of the transforming process is at the range of 500° C.~700° C.

5. The semiconductor process according to claim 1, wherein the transforming process comprises an oxidation process.

6. The semiconductor process according to claim 5, wherein the oxidation process comprises importing oxygen gas, ozone gas or vapor.

7. The semiconductor process according to claim 1, wherein the processing temperature of the densification process is higher than 1000° C.

8. The semiconductor process according to claim 7, wherein the processing temperature of the densification process is 1100° C.

9. The semiconductor process according to claim 1, wherein the silicon nitride compound comprises trisilylamine (TSA).

10. The semiconductor process according to claim 1, wherein the steps of filling the silicon nitride compound and performing the transforming process comprise a flowable chemical vapor deposition (FCVD) process or a spin-on dielectric (SOD) process.

11. The semiconductor process according to claim 1, wherein the silicon rich layer is formed through performing a Plasma Enhanced Chemical Vapor Deposition (PECVD) process or performing an Atomic Layer Deposition (ALD) process.

* * * * *